(12) United States Patent
Yeon et al.

(10) Patent No.: US 10,008,640 B2
(45) Date of Patent: Jun. 26, 2018

(54) SEMICONDUCTOR LIGHT EMITTING APPARATUS AND METHOD OF MANUFACTURING SAME

(71) Applicant: Samsung Electronics Co., Ltd., Suwon-si, Gyeonggi-do (KR)

(72) Inventors: Ji Hye Yeon, Cheongju-si (KR); Han Kyu Seong, Seoul (KR); Yong Il Kim, Seoul (KR); Jung Sub Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/181,935

(22) Filed: Jun. 14, 2016

(65) Prior Publication Data

US 2017/0130909 A1    May 11, 2017

(30) Foreign Application Priority Data

Nov. 5, 2015   (KR) ........................ 10-2015-0155306

(51) Int. Cl.

| | |
|---|---|
| *F21V 9/00* | (2018.01) |
| *H01L 33/50* | (2010.01) |
| *F21K 9/233* | (2016.01) |
| *H01L 25/075* | (2006.01) |
| *F21V 23/00* | (2015.01) |
| *F21W 131/103* | (2006.01) |
| *F21Y 113/00* | (2016.01) |

(Continued)

(52) U.S. Cl.
CPC .............. *H01L 33/50* (2013.01); *F21K 9/233* (2016.08); *H01L 25/0753* (2013.01); *F21V 23/003* (2013.01); *F21W 2131/103* (2013.01); *F21Y 2105/10* (2016.08); *F21Y 2113/00* (2013.01); *F21Y 2113/13* (2016.08); *F21Y 2115/10* (2016.08); *H01L 2224/16225* (2013.01); *H05B 33/0857* (2013.01)

(58) Field of Classification Search
CPC ...... H01L 33/50; H01L 25/0753; F21K 9/233
USPC ......................................................... 362/231
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |

(Continued)

FOREIGN PATENT DOCUMENTS

| | | |
|---|---|---|
| JP | 2014-157752 | 8/2014 |
| JP | 2015-115241 | 6/2015 |

(Continued)

OTHER PUBLICATIONS

Chinese Office Action for corresponding Chinese Application No. 201610832204.0 dated Apr. 4, 2018.

*Primary Examiner* — Bryon T Gyllstrom
(74) *Attorney, Agent, or Firm* — Harness, Dickey & Pierce, PLC

(57) ABSTRACT

A light emitting apparatus includes at least one first light source and at least one second light source. The at least one first light source and at least one second light source may be configured to emit white light and cyan light, respectively, such that a ratio of luminous flux of the white light to luminous flux of the cyan light ranges from 19:1 to 370:1, based on a common magnitude of electrical current being applied to each of the at least one first light source and the at least one second light source.

20 Claims, 12 Drawing Sheets

(51) Int. Cl.
*F21Y 105/10* (2016.01)
*F21Y 115/10* (2016.01)
*F21Y 113/13* (2016.01)
*H05B 33/08* (2006.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,192,047 B2 | 6/2012 | Bailey et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,410,680 B2 | 4/2013 | Medendorp, Jr. et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,664,846 B2 * | 3/2014 | van de Ven | H01L 25/0753 313/498 |
| 8,735,931 B2 | 5/2014 | Han et al. | |
| 8,766,295 B2 | 7/2014 | Kim | |
| 8,884,508 B2 * | 11/2014 | Pickard | F21V 9/16 313/501 |
| 2003/0133292 A1 * | 7/2003 | Mueller | A45D 42/10 362/231 |
| 2004/0218387 A1 * | 11/2004 | Gerlach | F21K 9/00 362/231 |
| 2006/0018118 A1 * | 1/2006 | Lee | H05B 33/0869 362/231 |
| 2006/0243987 A1 | 11/2006 | Lai | |
| 2007/0223219 A1 * | 9/2007 | Medendorp, Jr. | C09K 11/586 362/231 |
| 2008/0106887 A1 * | 5/2008 | Salsbury | F21K 9/64 362/84 |
| 2010/0118374 A1 * | 5/2010 | Quach | F21V 3/00 359/239 |
| 2010/0165600 A1 * | 7/2010 | Ku | F21K 9/00 362/84 |
| 2011/0309773 A1 * | 12/2011 | Beers | H05B 33/086 315/312 |
| 2013/0258636 A1 * | 10/2013 | Rettke | H01L 25/0753 362/84 |
| 2015/0204493 A1 | 7/2015 | Omura et al. | |
| 2016/0195227 A1 * | 7/2016 | Rooijmans | F21K 9/50 362/231 |

FOREIGN PATENT DOCUMENTS

| | | |
|---|---|---|
| JP | 2015-128088 | 7/2015 |
| KR | 10-1071378 | 10/2011 |
| KR | 2012-0037298 A | 4/2012 |

* cited by examiner

SEMICONDUCTOR LIGHT EMITTING APPARATUS AND METHOD OF MANUFACTURING SAME

CROSS-REFERENCE TO RELATED APPLICATION

This application claims the priority and benefit of Korean Patent Application No. 10-2015-0155306, filed on Nov. 5, 2015, with the Korean Intellectual Property Office, the disclosure of which is incorporated herein by reference.

BACKGROUND

The inventive concepts relate to light emitting apparatuses and methods of manufacturing the same.

As a semiconductor device converting electrical energy into optical energy, a light emitting diode (LED) may include a semiconductor compound emitting light having a certain wavelength according to energy band gaps. The LED is being widely used as light sources in light emitting apparatus fields, as well as in displays such as mobile displays, TVs, and computer monitors.

In general, LED apparatuses may emit light to excite a wavelength conversion material to emit white light. The wavelength conversion material may include a phosphor. The LED apparatuses may use a semiconductor light emitting device as an excitation light source. The semiconductor light emitting device may emit light in a spectrum from ultraviolet light to blue light.

Research has been conducted seeking to improve a color rendering index (CRI) of a light emitting apparatus emitting white light while reducing and/or minimizing a reduction in luminous efficacy of radiation (LER) thereof.

SUMMARY

Some example embodiments of the inventive concepts may provide a light emitting apparatus having improved color quality and a method of manufacturing the same.

According to some example embodiments, a light emitting apparatus may include at least one first light source and at least one second light source. The at least one first light source may be configured to emit white light. The at least one first light source may include at least one light emitting diode (LED) chip configured to emit light having a peak wavelength in a wavelength region of about 440 nm to about 460 nm and at least one phosphor configured to be excited by light emitted by the at least one LED chip, such that the at least one phosphor emits light having a peak wavelength in a wavelength region of about 490 nm to about 580 nm or a wavelength region of about 580 nm to about 630 nm. The at least one second light source may be configured to emit cyan light having a peak wavelength in a wavelength region of about 460 nm to about 490 nm. The light emitting apparatus may be configured to apply a common magnitude of electrical power to each of the at least one first light source and the at least one second light source such that a ratio of luminous flux of the white light emitted by the at least one first light source to luminous flux of the cyan light emitted by the at least one second light source ranges from about 19:1 to about 370:1.

According to some example embodiments, a light emitting apparatus may include at least one first light source configured to white light, at least one second light source configured to emit cyan light, and a driving control chip configured to control a separate supply of electrical power to each of the at least one first light source and the at least one second light source, such that a common magnitude of electrical current is applied to each of the at least one first light source and the at least one second light source, and a ratio of luminous flux of the white light to luminous flux of the cyan light ranges from about 19:1 to about 370:1 at an identically applied current.

According to some example embodiments, an apparatus may include a substrate and an array of light sources on the substrate. The array may include a pattern of at least one first light source and at least one second light source. The at least one first light source may be configured to emit white light and the at least one second light source being configured to emit cyan light. The array of light sources may be configured to emit white light and cyan light, based on a common magnitude of electrical power being received at both the at least one first light source and the at least one second light source, such that a ratio of luminous flux of the white light emitted by the at least one first light source to luminous flux of the cyan light emitted by the at least one second light source ranges from about 19:1 to about 370:1.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1A:
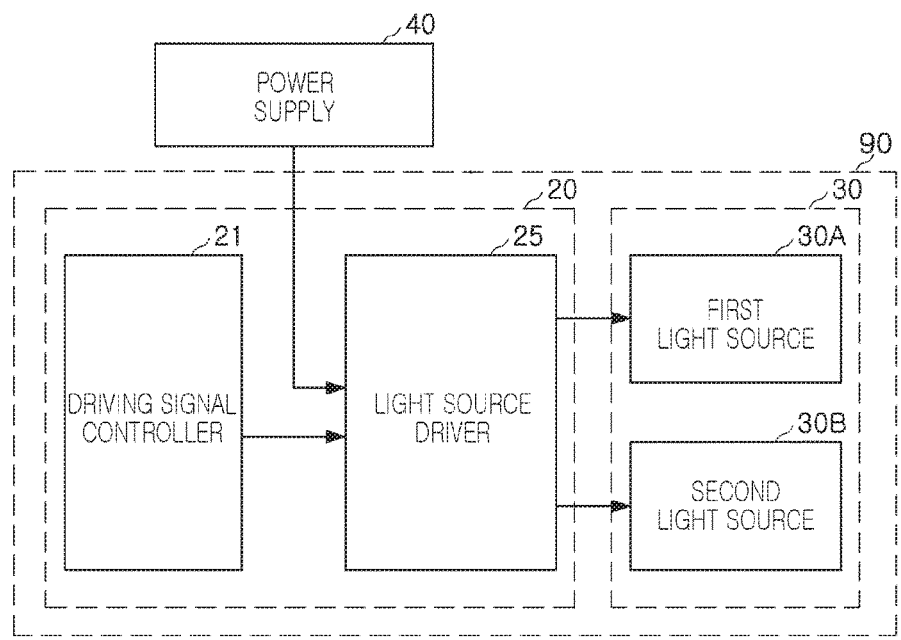
FIG. 1A and FIG. 1B are block diagrams of principal components of a light emitting apparatus according to some example embodiments of the inventive concepts, respectively.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being to the accompanying drawings, in which some example embodiments are shown. Example embodiments, may, however, be embodied in many different forms a contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as nded to be limiting of example embodiments. As used herein, the singular forms "a," "an" and "the" are intended to include the is of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The contents of the inventive concepts described below may have a variety of configurations and propose only a particular configuration herein, but are not limited thereto.

Figure 1B:
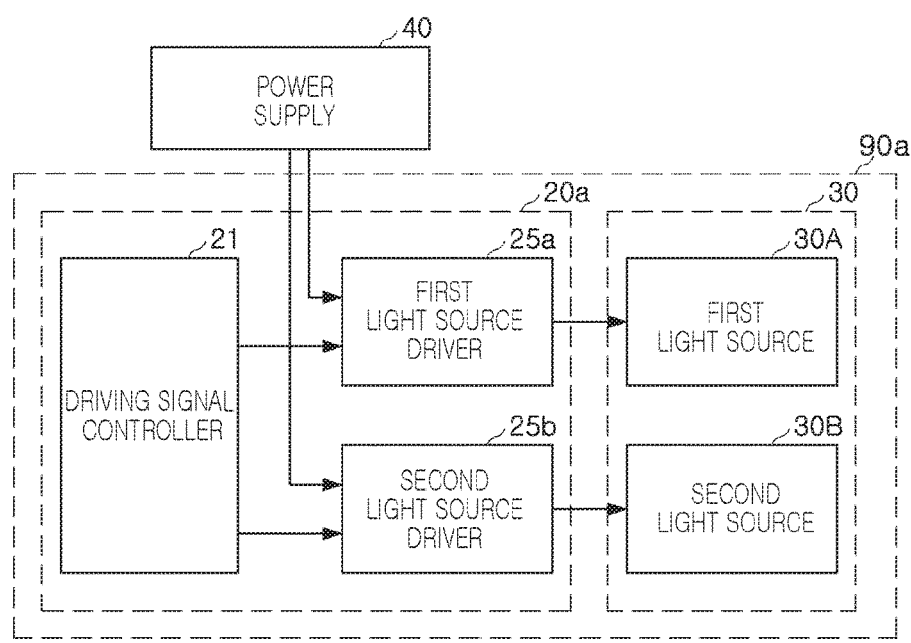

FIG. 1A and FIG. 1B are block diagrams of principal components of a light emitting apparatus according to some example embodiments of the inventive concepts, respectively.

Referring to FIG. 1A, a light emitting apparatus 10 may include a driving controller 20, a light source 30, and a power supply 40. The driving controller 20 and the light source 30 may form a light source module 90.

The power supply 40 may supply alternating current (AC) or direct current (DC) electrical power to a light source driver 25 inclined in the driving controller 20.

The driving controller 20 may include the light source driver 25 and a driving signal controller 21 configured to provide a driving signal for controlling the light source driver 25. The light source driver 25 may be connected to the power supply 40 to receive power therefrom, and may supply, control a supply of, etc. an amount ("magnitude") of electrical power, including a magnitude of an electrical current controlled by a driving signal of the driving signal controller 21 to a first light source 30A and a second light source 30B. In the example embodiment, the light source driver 25 may be controlled to apply a current ("an electrical current") having an identical level (a "common magnitude of electrical current") to the first and second light sources 30A and 30B.

The driving controller 20 may include a processor. The driving controller 20 may include a memory. The memory may include a non-transitory computer-readable storage medium. The memory may store one or more instances of computer-executable instructions. The driving controller 20 may include a processor that is configured to execute one or more of the computer-readable instructions to implement at least one of the light source driver 25 and a driving signal controller 25. The driving controller 20 may include a driving control chip, as is described below in more detail with reference to at least FIG. 2.

In some example embodiments, the driving controller 20 may further include a communications module configured to transmit and/or receive color rendering index (CRI) and/or correlated color temperature (CCT) data of the light emitting apparatus 10 to/from an inside or outside of the light emitting apparatus 10. An outside of the light emitting apparatus 10 may include a device that is external to the light emitting apparatus 10. The driving controller 20 may also further include a signal processor configured to process data provided (e.g., "generated") by at least one of an illumination sensor, a motion sensor, and an image sensor, and transmitting and/or receiving the processed data to/from the inside or outside of the light emitting apparatus 10. This will be described below in more detail with reference to FIGS. 15 through 17.

The light source 30 may include the first light source 30A emitting white light and the second light source 30B emitting cyan light. The light source 30 may mix light emitted by the first and second light sources 30A and 30B with each other to emit white light. The first and second light sources 30A and 30B may include one or more arrays of a plurality of light emitting diodes (LEDs), respectively.

Referring to FIG. 1B, a light emitting apparatus 10a may include a driving controller 20a, a light source 30, and a power supply 40. The driving controller 20a and the light source 30 may form a light source module 90a.

In the example embodiment, the driving controller 20a may include a first light source driver 25a, a second light source driver 25b, and a driving signal controller 21 configured to provide a driving signal for controlling the first light source driver 25a and the second light source driver 25b.

The first and second light source drivers 25a and 25b may be connected to the power supply 40, respectively, to receive electrical power therefrom, and may control the supply of separate magnitudes of electrical power (e.g., separate magnitudes of electrical current), individually controlled according to driving signals of the driving signal controller 21, to a first light source 30A and a second light source 30B, respectively. Therefore, the first and second light sources 30A and 30B may be controlled to receive respective magnitudes of electrical current so as to emit light having particular luminous flux, respectively.

Figure 2:
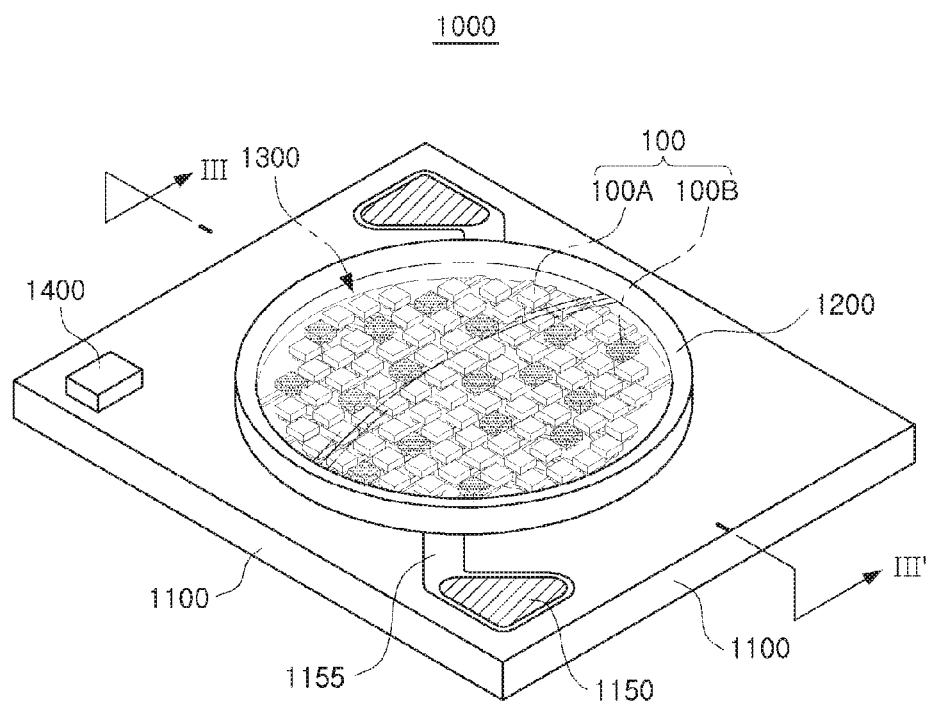
FIG. 2 is a schematic perspective view of a light source module according to some example embodiments of the inventive concepts.
Figure 3:
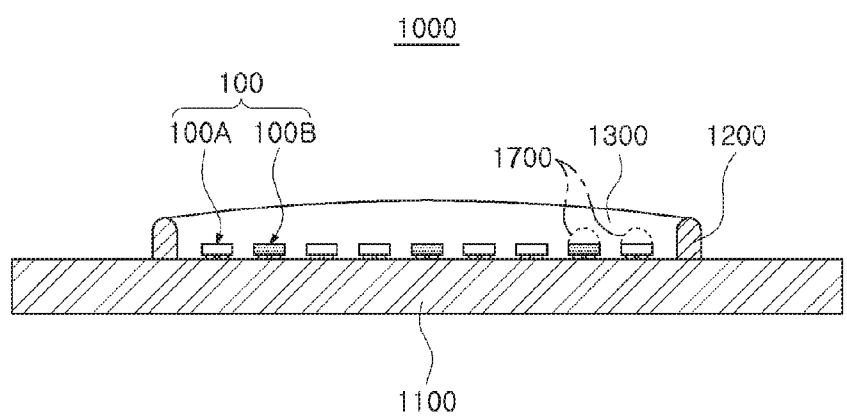
FIG. 3 is a schematic cross-sectional view of the light source module according to some example embodiments of the inventive concepts.

FIG. 2 is a schematic perspective view of a light source module according to some example embodiments of the inventive concepts. FIG. 3 is a schematic cross-sectional view of the light source module according to some example embodiments of the inventive concepts. FIG. 3 is a cross-sectional view taken along line III-III' of FIG. 2.

Referring to FIGS. 2 and 3, a light emitting apparatus may include a light source module 1000. The light source module 1000 according to some example embodiments of the inventive concepts may include a substrate 1100, a light source array 100 of first light sources 100A and second light sources 100B mounted on the substrate 1100, a dam 1200 surrounding the first and second light sources 100A and 100B, an encapsulant 1300 covering the first and second light sources 100A and 100B, and a driving control chip 1400.

The light sources 30 described above with reference to FIGS. 1A and 1B may include the first and second light sources 100A and 100B, and the driving controller 20 described above with reference to FIG. 1A may include the driving control chip 1400.

The substrate 1100 may contain conductive and insulating materials, and may include an upper surface having a metallic pattern 1155 connected to the first and second light sources 100A and 100B and having a terminal 1150 connected to the metallic pattern 1155.

The substrate 1100 may be, for example, a printed circuit board (PCB) of an FR4 type, and may include an organic resin such as epoxy, triazine, silicone, and polyimide, or a ceramic such as SiN, AlN, or $Al_2O_3$, or a metal and a metallic compound. The substrate 1100 may also include a PCB, a metal core printed circuit board (MCPCB), a metal printed circuit board (MPCB), a flexible printed circuit board (FPCB), a copper clad laminate (CCL), a metal copper clad laminate (MCCL), and the like.

The metallic pattern 1155 may be electrically connected to the first and second light sources 100A and 100B, and may be electrically connected to an external power source through the terminal 1150, so as to apply an electrical signal to the first and second light sources 100A and 100B. The metallic pattern 1155 and the terminal 1150 may have a conductive thin film shape, and for example, may include a copper foil.

The array 100 of first and second light sources 100A and 100B may be disposed on the substrate 1100, respectively. The first and second light sources 100A and 100B may include an LED chip which includes an n-type semiconductor layer, a p-type semiconductor layer, and an active layer disposed therebetween. The first light sources 100A may emit white light, and second light sources 100B may emit cyan light having a peak wavelength in a wavelength region from about 460 nm to about 490 nm. The first light sources 100A may have a structure in which at least one chip emitting blue light includes a yellow phosphor, or a structure in which a chip emitting blue light includes red and green phosphors. The first light sources 100A may include, for example, at least one chip emitting light having a peak wavelength in a wavelength region from about 440 nm to about 460 nm, and at least one kind of phosphor emitting light having a peak wavelength in a wavelength region from about 490 nm to about 580 nm or from about 580 nm to about 630 nm. The second light sources 100B may include a chip emitting cyan light, and may not include a phosphor. This will be described below in more detail with reference to FIGS. 7 through 9. The first and second light sources 100A and 100B may be disposed ("mounted") on the substrate such that the light emitting apparatus 1000 has a flip-chip structure of light sources.

The array 100 may include a pattern of first and second light sources 100A and 100B. The pattern may include a particular distribution of second light sources 100B between the first light sources 100A according to a desired (and/or alternatively, predetermined) sequence. The pattern of first and second light sources 100A and 100B in the array 100 of light sources may include a symmetrical or rotationally symmetrical pattern to provide uniform light distribution. This symmetrical pattern ("arrangement") may allow light emitted by the first and second light sources 100A and 100B to be uniformly mixed with each other even when a ratio of luminous flux of the first light sources 100A to that of the second light sources 100B is changed, thereby providing a particular white light.

The first and second light sources 100A and 100B may have the same size as each other, and the number ("quantity") of the first light sources 100A may be more than that of the second light sources 100B, but the inventive concepts is not limited thereto.

For example, the number of the second light sources 100B may be from about 1% to about 16% of the total number of light sources 100, and for example, may be from about 5% to about 12%. According to the percentages, the second light sources 100B may be disposed in a sequence between the first light sources 100A, and in some example embodiments, only a single second light source 100B may be disposed therebetween.

As the numbers of the first and second light sources 100A and 100B in the light sources array 100 are different from each other, the first and second light sources 100A and 100B may have different luminous flux defined as a measure of visible light respectively emitted by the first and second light sources 100A and 100B at an identically applied current.

As in Table 1 below, a ratio of the number of the second light sources 100B to the total number of the light sources 100A and 100B in the light sources array 100 may allow a ratio of luminous flux of white light emitted by the first light sources 100A to that of cyan light emitted by the second light sources 100B to be changed.

TABLE 1

| Ratio of Number of Second Light Sources | Luminous Flux Ratio of White Light to Cyan Light |
|---|---|
| 1% | 363.07 |
| 5% | 69.68 |
| 8% | 42.17 |
| 12% | 26.89 |
| 14% | 22.53 |
| 16% | 19.25 |

Table 1 exhibits values on a light source module emitting light having a color temperature of 5,000K. A ratio of luminous flux of emitted white light to that of emitted cyan light may range from about 19:1 to about 370:1, and for example, may range from about 20:1 to about 80:1. When the luminous flux ratio is smaller than the range, that is, luminous flux of the second light sources 100B is relatively greater, luminous efficacy of radiation (LER) of the light source module may be decreased, or it may be difficult to provide light having a particular color temperature.

When the luminous flux ratio is greater than the range, that is, luminous flux of light emitted by the second light sources 100B is relatively smaller than the luminous flux of light emitted by the first light sources 100A, improvements in color quality may be reduced. This will be described below in more detail with reference to FIGS. 5 and 6.

The light source module 1000 may not be completely required to satisfy the ratio of the number of the second light sources 100B to the total number of the light sources 100A and 100B in the array 100 and the luminous flux ratio at the same time, and for example, may be configured to emit light having a particular luminous flux ratio in some example embodiments. As such, when the ratio of the number of the second light sources 100B to the total number of the light sources 100 is beyond the range of Table 1, the first and second light sources 100A and 100B may have different sizes, that is, light emitting areas, or may receive different driving currents, respectively, as described above with reference to FIG. 1B, thereby being controlled to satisfy the luminous flux ratio.

The mixed light emitted by the first light sources 100A and the second light sources 100B may have a CRI from about 80 to about 99. Control of the luminous flux ratio may also allow a CCT of the mixed light emitted by the first light sources 100A and the second light sources 100B to be from 2,000K to 8,000K.

The dam 1200 may be disposed to surround the first and second light sources 100A and 100B on the substrate 1100 to define an internal light emitting area. The dam 1200 may be disposed to protrude upwardly from an upper surface of the substrate 1100, and may have a ring shape. In the example embodiment, shapes of the substrate 1100 and the dam 1200 are not limited to a quadrangular shape and a circular shape, respectively, and the arrangements of the first and second light sources 100A and 100B may thus be modified in various ways. In some embodiments, the dam 1200 may also be omitted.

The encapsulant 1300 may at least partially fill an internal space partitioned by the dam 1200, and may cover the first and second light sources 100A and 100B. The encapsulant 1300 may have an upwardly convex dome shape to adjust an orientation angle of light externally emitted, but is not limited thereto.

The encapsulant 1300 may include a light transmitting material in such a manner that light emitted by the first and second light sources 100A and 100B may be externally emitted. The light transmitting material may be formed using a resin such as silicone or epoxy. The encapsulant 1300 may be formed by injecting a resin on the substrate 1100 and hardening the injected resin by methods such as heating, light irradiation, and passage of time. In some example embodiments, the encapsulant 1300 may also contain a light-reflective material to diffuse light externally emitted. The light transmitting material may be formed using, for example, $SiO_2$, $TiO_2$, $Al_2O_3$, and the like. In some example embodiments, the encapsulant 1300 may also be omitted, and each of the first and second light sources 100A and 100B may also include a separate lens 1700.

The driving control chip 1400 may perform functions corresponding to the driving controller 20 of FIG. 1A and the driving controller 20a of FIG. 1B, and may store driving information of the first and second light sources 100A and 100B. An arrangement and a shape of the driving control chip 1400 are not limited to those illustrated in FIG. 2.

For example, in some example embodiments, the driving control chip 1400 may also be disposed within the substrate 1100.

Figure 4:
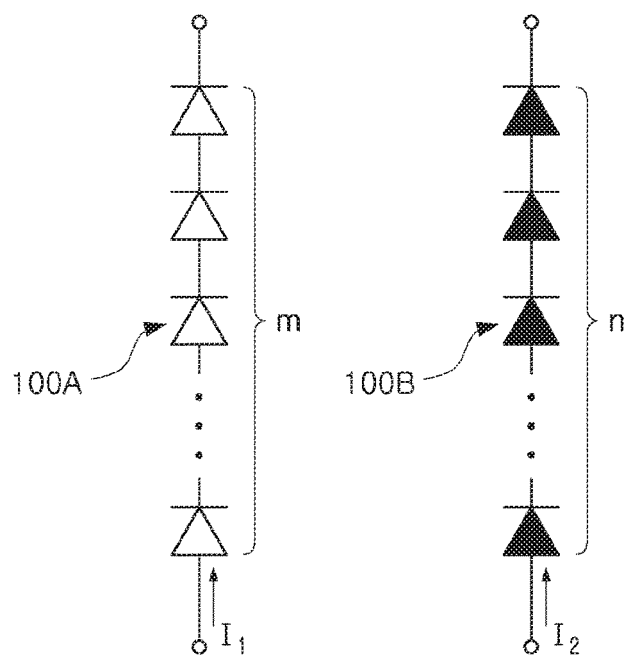
FIG. 4 is a schematic view of a circuit of each light source employed in a light source module according to some example embodiments of the inventive concepts.

FIG. 4 is a schematic view of a circuit of each light source employed in a light source module according to some example embodiments of the inventive concepts.

Referring to FIG. 4, the first and second light sources 100A and 100B described above with reference to FIGS. 2 and 3 may be provided as different LED arrays, respectively.

An "m" number ("quantity") of the first light sources 100A may be connected to each other in series by the circuit pattern 1155 formed on the substrate 1100 of FIG. 2. An "n" number ("quantity") of the second light sources 100B may be connected to each other in series by the circuit pattern 1155 formed on the substrate 1100 of FIG. 2. The first and second light sources 100A and 100B respectively connected to each other in series may be individually driven by currents I1 and I2 that are respectively provided by the first and second light source drivers 25a and 25b. As such, the first and second light sources 100A and 100B may be individually driven, based on the supply of electrical power thereto, to emit light having different luminous flux, and may be controlled to satisfy a particular ratio of the luminous flux of the light emitted by the first light sources 100A to the light emitted by the second light sources 100B.

Figure 5:
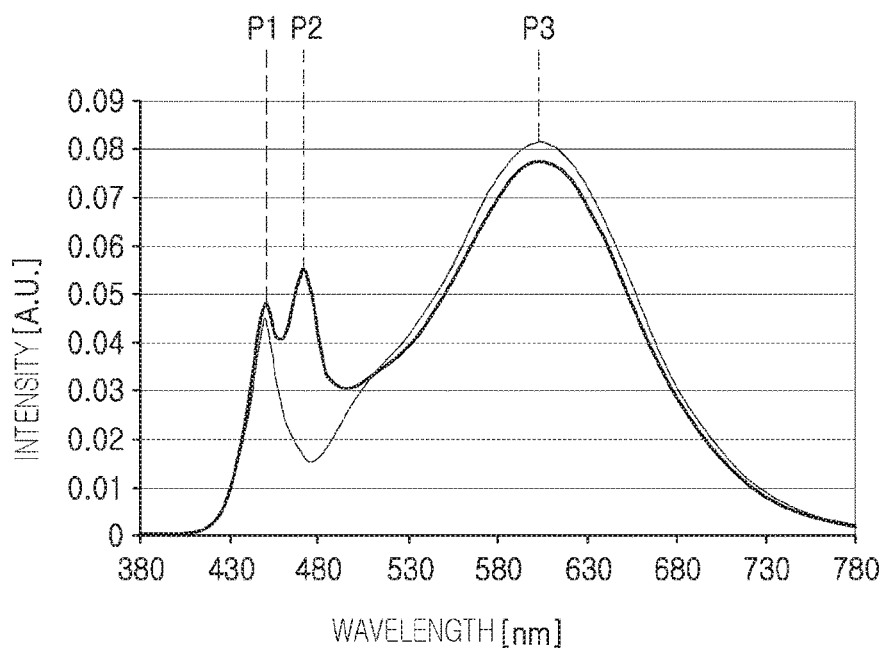
FIG. 5 and FIG. 6 are graphs of spectra of light emitted by a light source module according to some example embodiments of the inventive concepts, respectively.
Figure 6:
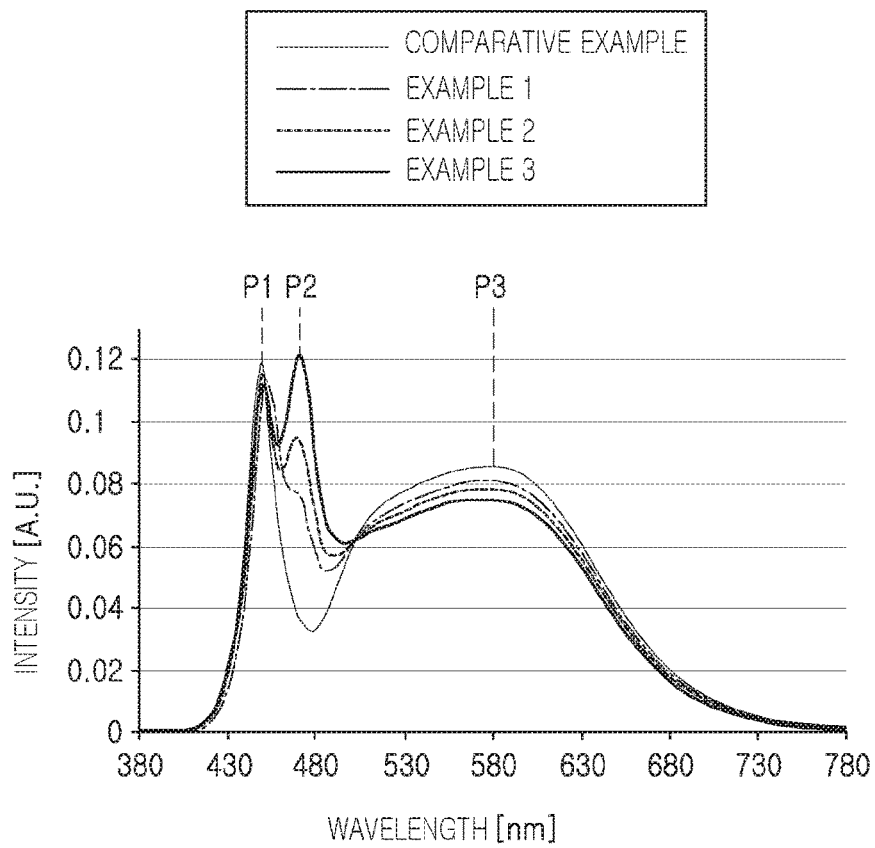

FIG. 5 and FIG. 6 are graphs illustrating spectra of light emitted by a light source module according to some example embodiments of the inventive concepts, respectively. FIG. 5 is an example in which warm white light is emitted. FIG. 6 is an example in which cool white light is emitted.

Referring to FIG. 5, spectra of emitted warm white light of a comparative example and an example are illustrated. In the comparative example, a light source module only including the first light sources 100A of FIG. 2 may particularly have a structure in which the first light sources 100A include a blue chip and red and green phosphors. In the example, a light source module may include the first light sources 100A having the structure described above and the second light sources 100B emitting cyan light, and may have a structure in which the ratio of the number of the second light sources 100B to the total number of the light sources 100 is 5%.

As illustrated in FIG. 5, light having a first peak wavelength P1 and a third peak wavelength P3 may be emitted in the comparative example, and light having a first peak wavelength P1, a second peak wavelength P2, and a third peak wavelength P3 may be emitted in the example. The first through third peak wavelengths P1, P2, and P3 may appear in regions corresponding to blue, cyan, and red sequentially from a low wavelength region, respectively. The first peak wavelength P1 may appear within a range from about 440 nm to about 460 nm, the second peak wavelength P2 may appear within a range from about 470 nm to about 490 nm, and the third peak wavelength P3 may appear within a range from about 580 nm to about 630 nm. In particular, in the example, intensity of the first peak wavelength P1 may be greater than that of the second peak wavelength P2.

As in Table 2 below, various characteristics of white light was also measured.

TABLE 2

|  | LER | CCT | CRI | R9 | R12 | R13 |
|---|---|---|---|---|---|---|
| Comparative Example | 92.3 | 2985 | 83.8 | 18.5 | 73.8 | 83.3 |
| Example | 89.3 | 3319 | 86.5 | 39.3 | 81.9 | 93.6 |

Referring to FIG. 2, LER is shown in lm/W units, and CCT, CRI, and R9, R12, and R13, that is, special CRIs, are shown in order.

In the example, LER was reduced in comparison to the comparative example, but CRIs were increased, and in particular, special CRIs were relatively greatly increased. More specifically, the CRI was increased by 2.7, and R9, R12, and R13 were increased by 112%, 11%, and 12%, respectively. Therefore, the example may include the second light sources 100B emitting cyan light, may significantly reduce a decrease in LER, and may emit light close to the level of sunlight in comparison to the comparative example.

Referring to FIG. 6, spectra of emitted cool white light of a comparative example and examples 1 to 3 are illustrated. In the comparative example, a light source module only including the first light sources 100A of FIG. 2 may particularly have a structure in which the first light sources 100A include a blue chip and red and green phosphors. In examples 1 to 3, a light source module may include the first light sources 100A having the structure described above and the second light sources 100B emitting cyan light, and may have a structure in which the ratios of the numbers of the second light sources 100B to the total number of the light sources 100 are 5% in example 1, 8% in example 2, and 12% in example 3, respectively.

As illustrated in FIG. 6, light having a first peak wavelength P1 and a third peak wavelength P3 may be emitted in the comparative example, and light having a first peak wavelength P1, a second peak wavelength P2, and a third peak wavelength P3 may be emitted in examples 1 to 3. In examples 1 to 3, a ratio of intensity of the first peak wavelength P1 to that of the second peak wavelength P2 may be within a range from 0.3 to 1.5. In particular, in example 3, the intensity of the second peak wavelength P2 may be greater than that of the first peak wavelength P1.

As in Table 3 below, various characteristics of white light was also measured.

TABLE 3

|  | LER | CCT | CRI | R9 | R12 | R13 |
|---|---|---|---|---|---|---|
| Comparative Example | 129.2 | 4788 | 82.1 | 3 | 58 | 80.1 |
| Example 1 | 124.6 | 5315 | 85.7 | 16.6 | 68.8 | 86.5 |
| Example 2 | 121.7 | 5606 | 87.3 | 25.5 | 72.7 | 90.0 |
| Example 3 | 118.0 | 6207 | 88.3 | 39.2 | 74.1 | 94.5 |

In examples 1 to 3, LER was reduced in comparison to the comparative example, but CRIs were increased, and in particular, special CRIs such as R9, R12, and R13 were relatively greatly increased. More specifically, the CRI was increased by 3.6, and R9, R12, and R13 were increased by 450%, 19%, and 8%, respectively, in example 1. As the ratio of the number of the second light sources 100B to the total number of the light sources 100 was raised, the CRIs were further increased. Although the ratio of the number of the second light sources 100B to the total number of the light sources in the light sources array 100 was increased, the LER was reduced due to a relative reduction in a degree of LER as compared to the case in which light sources including cyan chips with phosphor layers disposed thereon are included in the light source module 1000 in place of the second light sources 100B of examples 1 to 3.

In Table 3, CCT was increased depending on a change in the ratio of the number of the second light sources 100B to the total number of the light sources in a light sources array 100. Therefore, light having a particular color temperature may be provided by the light emitting apparatus by adjusting the ratio of the number of the second light sources 100B to the total number of the light sources in a light sources array 100. In this case, light having various color temperatures may be provided only with the ratio of the number of the light sources in a light sources array 100 mounted in the light source module 1000 to the total number of the light sources 100 without adjusting a type or amount of a phosphor, so that the light source module 1000 may be readily manufactured.

Figure 7:
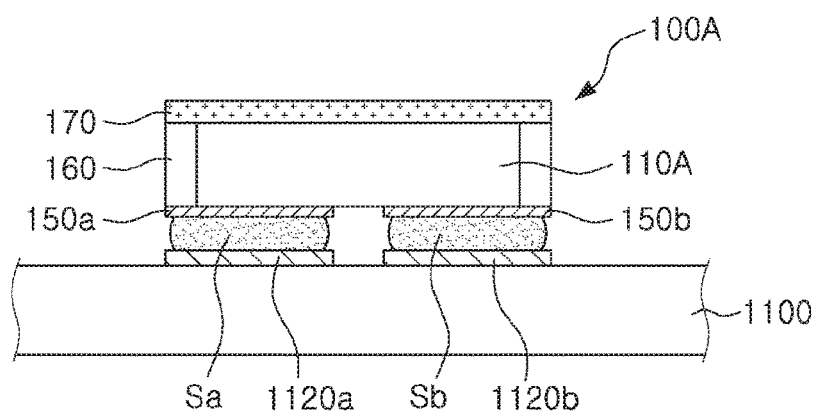
FIG. 7 and FIG. 8 are cross-sectional views of light sources according to some example embodiments of the inventive concepts, respectively.
Figure 8:
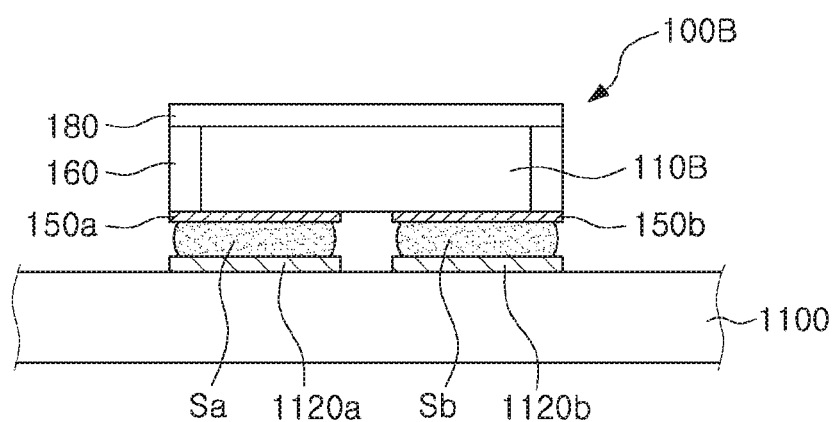

FIG. 7 and FIG. 8 are cross-sectional views of light sources according to some example embodiments of the inventive concepts, respectively. FIG. 7 depicts the first light sources 100A of FIG. 2, and FIG. 8 illustrates the second light sources 100B of FIG. 2.

Referring to FIG. 7, the first light sources 100A according to an example embodiment may include a first chip 110A emitting blue light, first and second electrodes 150a and 150b disposed on a lower surface of the first chip 110A, a reflective layer 160 surrounding a side surface of the first chip 110A, and a phosphor layer 170 disposed on an upper surface of the first chip 110A.

The first and second electrodes 150a and 150b may include a conductive material, and may be electrically connected to first and second electrode patterns 1120a and 1120b of the substrate 1100 through first and second bumps Sa and Sb, respectively.

The reflective layer 160 may reflect light emitted from the first chip 110A to the side surface toward an upper portion thereof. The reflective layer 160 may contain a light-reflective material, and may include, for example, $SiO_2$, $TiO_2$, or $Al_2O_3$.

The phosphor layer 170 may include a phosphor converting a portion of blue light emitted by the first chip 110A into light having a wavelength different from that of the blue light, and this may allow the portion of the blue light to be converted into yellow and/or red and green light. For example, the phosphor layer 170 may convert light emitted by the first chip 110A and having a peak wavelength in a wavelength region from about 440 nm to about 460 nm into light having a peak wavelength in a wavelength region from about 490 nm to about 580 nm and/or from about 580 nm to about 630 nm. Therefore, the first light sources 100A may emit white light. The phosphor layer 170 may be a ceramic film including a resin layer in which a phosphor is dispersed, or pellets of a ceramic phosphor. A phosphor available in the example embodiment will be described below in more detail with reference to Table 4.

Referring to FIG. 8, the second light sources 100B according to an example embodiment may include a second chip 110B emitting cyan light, first and second electrodes 150a and 150b disposed on a lower surface of the second chip 110B, a reflective layer 160 surrounding a side surface of the second chip 110B, and a transparent resin layer 180 disposed on an upper surface of the second chip 110B.

The second light sources 100B may include the transparent resin layer 180 in place of the phosphor layer 170 unlike the first light sources 100A. As a layer protecting the upper surface of the second chip 110B, the transparent resin layer 180 may not contain a phosphor. Therefore, cyan light emitted by the second chip 110B may be fully emitted without being converted, and may reduce and/or prevent reduction in LER that may occur by optical conversion of the cyan light. The transparent resin layer 180 may include a stacked transparent film for widening a viewing angle of the second light sources 100B, and this may allow the viewing angle of the second light sources 100B to be identical or greater than that of the first light sources 100A.

In some embodiments, the transparent resin layer 180 may also be omitted.

Figure 9:
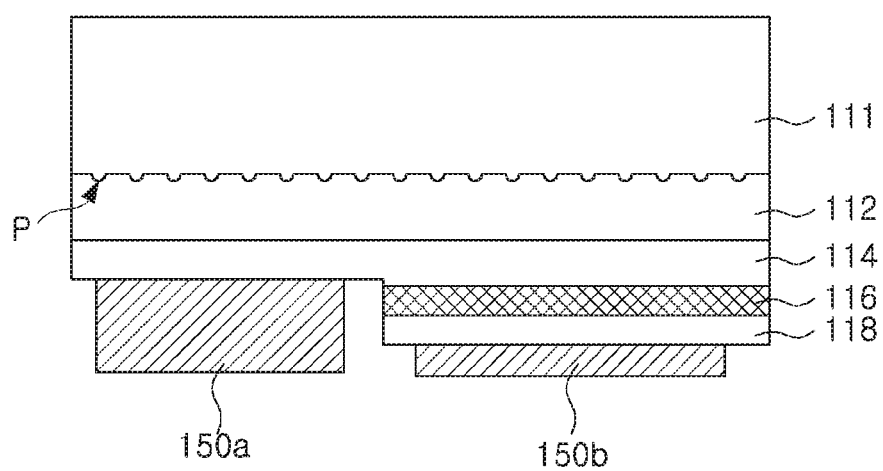
FIG. 9 is a cross-sectional view of a chip employable in a light source according to some example embodiments of the inventive concepts.

FIG. 9 is a cross-sectional view of a chip employable in a light source according to some example embodiments of the inventive concepts.

Referring to FIG. 9, a semiconductor chip 110 may include a growth substrate 111, and a first conductive semiconductor layer 114, an active layer 116, a second conductive semiconductor layer 118, a first electrode 150a, and a second electrode 150b sequentially stacked on the growth substrate 111. The semiconductor chip 110 may further include a buffer layer 112 disposed between the growth substrate 111 and the first conductive semiconductor layer 114. The semiconductor chip 110 may correspond to the first and second chips 110A and 110B described above with reference to FIGS. 7 and 8.

The growth substrate 111 may be an insulating substrate such as sapphire. The inventive concepts are not, however, limited thereto, and the growth substrate 111 may be a conductive substrate or a semiconductor substrate. For example, the growth substrate 111 may be SiC, Si, $MgAl_2O_4$, MgO, $LiAlO_2$, $LiGaO_2$, or GaN other than sapphire. The growth substrate 111 may have an upper surface with an uneven pattern P formed thereon, and this may allow light extraction efficiency to be increased and quality of semiconductor layers grown on the growth substrate 111 to be improved.

The buffer layer 112 may be $In_xAl_yGa_{1-x-y}N$ ($0 \leq x \leq 1$, $0 \leq y \leq 1$). For example, the buffer layer 112 may be GaN, AlN, AlGaN, or InGaN, and may include a plurality of layers, or may have a gradually changed composition.

The first and second conductive semiconductor layers 114 and 118 may include semiconductors doped with n- and p-type impurities, respectively, but are not limited thereto, and may reversely include semiconductors doped with p- and n-type impurities, respectively. The first and second conductive semiconductor layers 114 and 118 may include a nitride semiconductor, such as a material having a composition of $Al_xIn_yGa_{1-x-y}N$ ($0 \leq x \leq 1$, $0 \leq y \leq 1$, $0 \leq x+y \leq 1$). Each of the first and second conductive semiconductor layers 114 and 118 may include a single layer, and may also include a plurality of layers having different characteristics such as a doping concentration and a composition. The first and second conductive semiconductor layers 114 and 118 may be formed using an AlInGaP or AlInGaAs-based semiconductor other than the nitride semiconductor. In the example embodiment, the first conductive semiconductor layer 114 may be, for example, an n-type gallium nitride (n-GaN) doped with silicon (Si) or carbon (C), and the second conductive semiconductor layer 118 may be a p-type gallium nitride (p-GaN) doped with magnesium (Mg) or zinc (Zn).

The active layer 116 may be disposed between the first and second conductive semiconductor layers 114 and 118 to emit light having a desired (and/or alternatively, predetermined) level of energy by a recombination of electrons and holes. The active layer 116 may include a single material such as indium gallium nitride (InGaN), but when the active layer 116 includes, for example, a nitride semiconductor having a single quantum well (SQW) structure or a multiple quantum well (MQW) structure in which quantum barrier layers and quantum well layers are alternately stacked on each other, the active layer 116 may have a GaN/InGaN structure. A content of indium (In) contained in the active layer 116 may allow a light emission wavelength thereof to be adjusted. Therefore, the first and second chips 110A and 110B described above with reference to FIGS. 7 and 8 may include active layers 116 having different contents of In, respectively. The second chip 110B may include the active layer 116 having a higher content of In than that of In contained in the active layer 116 of the first chip 110A.

The first and second electrodes 150a and 150b may be disposed on the first and second conductive semiconductor layers 114 and 118 to be connected thereto, respectively.

The first and second electrodes 150a and 150b may have a structure including a single layer or multiple layers formed of a conductive material. For example, the first and second electrodes 150a and 150b may include at least one of a material such as gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), or platinum (Pt), or alloys thereof.

Figure 10:
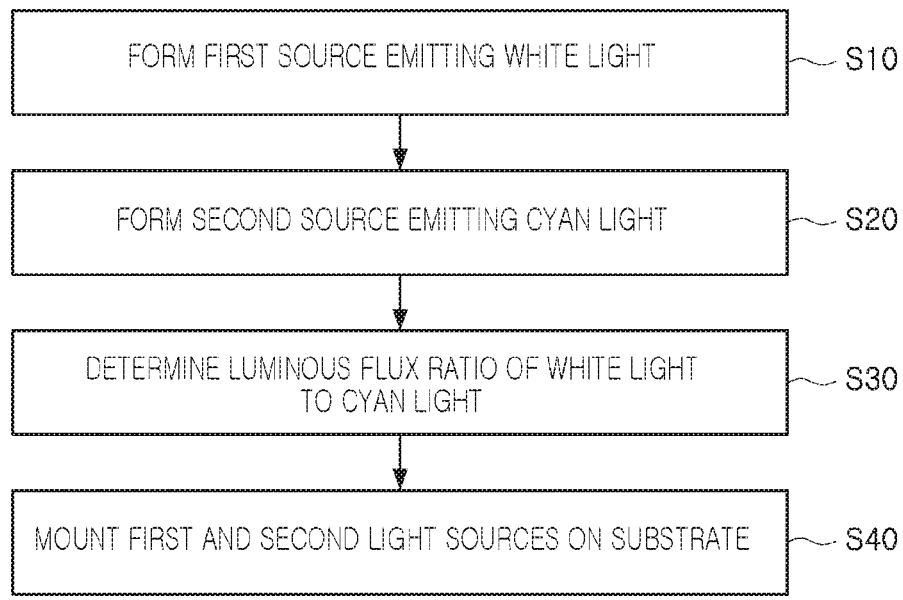
FIG. 10 and FIG. 11 are flow charts illustrating a method of manufacturing a light source module according to some example embodiments of the inventive concepts, respectively.
Figure 11:
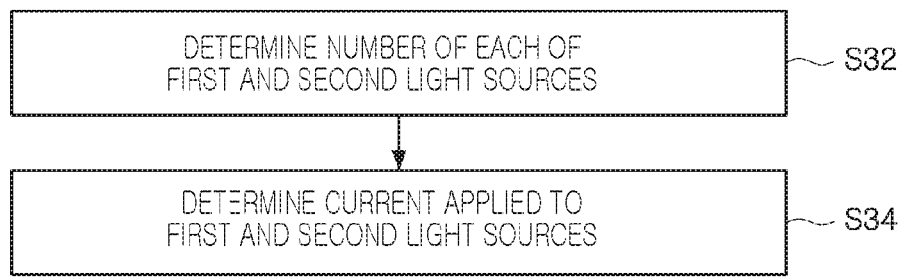

FIG. 10 and FIG. 11 are flow charts illustrating methods of manufacturing a light source module according to some example embodiments of the inventive concepts, respectively.

Referring to FIGS. 2 and 10, the method of manufacturing a light source module according to the example embodiment may include forming the first light sources 100A emitting white light (S10), forming the second light sources 100B emitting cyan light (S20), determining a ratio of luminous flux of the white light to that of the cyan light (S30), and mounting the first and second light sources 100A and 100B on the substrate 1100 (S40).

The forming of the first light sources 100A emitting white light (S10) and the forming of the second light sources 100B emitting cyan light (S20) may allow the first and second light sources 100A and 100B to have the structures described above with reference to FIGS. 7 through 9, respectively.

More specifically, the first and second light sources 100A and 100B may be formed by growing a nitride semiconductor layer including the first conductive semiconductor layer 114, the active layer 116, and the second conductive semiconductor layer 118, and the first and second light sources 100A and 100B may include the active layers 116, respectively, the active layers having respective different contents of In contained therein.

The determining of the ratio of the luminous flux of the white light to that of the cyan light (S30) may include determining a particular pattern of first and second light sources 100A and 100B in a light sources array 100. The determining may include determining the respective numbers of the first and second light sources 100A and 100B (S32) and determining currents respectively applied to the first and second light sources 100A and 100B (S34). The ratio of the luminous flux of the white light to that of the cyan light may be selected within a range from 20:1 to 80:1 as described above.

The luminous flux ratio may be determined by relatively adjusting the respective numbers of the mounted first and second light sources 100A and 100B (S32). In some embodiments, light emission regions of the first and second light sources 100A and 100B may also be adjusted in place of the respective numbers of the mounted first and second light sources 100A and 100B. The luminous flux ratio may also be determined by determining values of electrical signals including currents respectively applied to the first and second light sources 100A and 100B (S34).

One or all of the two operations (S32 and S34) may be performed. For example, only the respective numbers of the first and second light sources 100A and 100B may allow the luminous flux ratio to be adjusted, and in this case, levels of currents respectively applied to the first and second light sources 100A and 100B may be identical to each other. While the respective numbers of the first and second light sources 100A and 100B are determined, adjustment of currents respectively applied to the first and second light sources 100A and 100B may allow the luminous flux ratio to be satisfied.

In the operation (S30), determination of the luminous flux ratio may allow a CCT of the light source module 1000 to be adjusted to be within a certain range. For example, the respective numbers of the first and second light sources 100A and 100B may be determined to adjust the CCT, thereby facilitating CCT control.

Finally, a selected number of the first and second light sources 100A and 100B may be mounted on the substrate 1100 (S40) so that the light source module 1000 of FIG. 2 may be manufactured. The mounting at (S40) may include mounting at least one first light source 100A and at least one second light source (100B) on a substrate 1100 according to a particular light source pattern to configure the array 100 of light sources to emit white and cyan light such that a ratio of luminous flux of the white light to luminous flux of the cyan light that is from about 19:1 to about 370:1, based on the at least one first light source and the at least one second light source receiving a common magnitude of electrical current.

Figure 12:
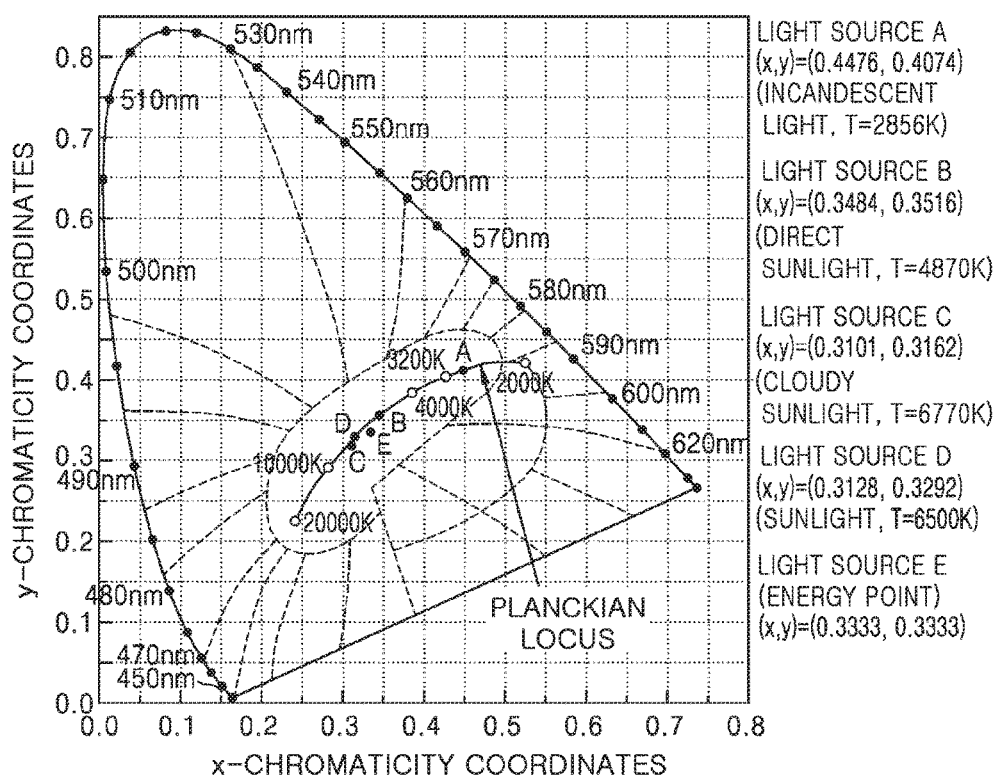
FIG. 12 is a CIE 1931 color space chromaticity diagram illustrating a wavelength conversion material employable in a light source according to some example embodiments of the inventive concepts.

FIG. 12 is a CIE 1931 color space chromaticity diagram illustrating a wavelength conversion material employable in a light source according to some example embodiments of the inventive concepts.

Colors of light emitted by a light source may be adjusted according to wavelengths of an LED chip and to types and mixing ratios of wavelength conversion materials used. A white LED package may adjust a color temperature and a CRI of white light.

For example, when the LED chip emits blue light, a light emitting device package including at least one of yellow, green, and red phosphors may emit white light having a variety of color temperatures depending on mixing ratios of the yellow, green, and red phosphors. Conversely, a light emitting device package in which a green or red phosphor is applied to a blue LED chip may emit green or red light. As such, a combination of a light emitting device package emitting white light and a light emitting device package emitting green or red light may allow a color temperature and a CRI of white light to be adjusted. In addition, a light emitting device package may include at least one light emitting device emitting violet, blue, green, red or infrared light.

In this case, a light emitting apparatus may adjust a CRI of a sodium (Na) lamp to the level of sunlight, may emit white light having various color temperatures from 1,500K to 20,000K. If necessary, the light emitting apparatus may emit violet, blue, green, red, and orange visible light or infrared light to adjust a lighting color according to the light emitting apparatus' surroundings or desired moods. The light emitting apparatus may also emit light having a certain wavelength that is able to promote plant growth.

White light generated by a combination of a blue light emitting device with yellow, green, and red phosphors and/or green and red light emitting devices may have at least two peak wavelengths, and as illustrated in FIG. 12, (x, y) coordinates of the CIE 1931 color space chromaticity diagram may be located in an area of segments connecting coordinates: (0.4476, 0.4074), (0.3484, 0.3516), (0.3101, 0.3162), (0.3128, 0.3292), and (0.3333, 0.3333). Alternatively, (x, y) coordinates may be located in an area surrounded by the segments and a blackbody radiation spectrum. A color temperature of the white light may range from 1,500K to 20,000K.

Various types of materials such as a phosphor and a quantum dot (QD) may be used as a material converting a wavelength of light emitted by a semiconductor light emitting device.

The phosphor may have the following formulae and colors: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); green β-SiAlON:Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, red $SrLiAl_3N_4$: Eu, and red $Ln_{4-x}(Eu_zM_{1-z})_xSi_{12-y}Al_yO_{3+x+y}N_{18-x-y}$ (0.5≤x≤3, 0<z<0.3, 0<y≤4) (nitride-based), in which Ln may be at least one kind of element selected from the group consisting of group IIIa elements and rare earth elements, and M may be at least one kind of element selected from the group consisting of Ca, Ba, Sr and Mg; and KSF-based red $K_2SiF_6$:$Mn_4^+$, KSF-based red $K_2TiF_6$:$Mn_4^+$, KSF-based red $NaYF_4$:$Mn_4^+$, KSF-based red $NaGdF_4$:$Mn_4^+$, and KSF-based red $K_3SiF_7$:$Mn^{4+}$ (fluoride-based).

A phosphor composition may conform with stoichiometry, and respective elements thereof may be replaced with other elements in each group on the periodic table. For example, Sr may be substituted with Ba, Ca, Mg, and the like of alkaline earth (group II), and Y may be replaced with Tb, Lu, Sc, Gd, and the like of lanthanides. Eu or the like, an activator, may be substituted with Ce, Tb, Pr, Er, Yb, and the like according to particular energy levels. An activator may only be applied to the phosphor composition, or an additional sub-activator or the like may be applied to the phosphor composition to modify characteristics thereof.

In particular, a fluoride-based red phosphor may be coated with a fluoride not containing Mn, or may further include an organic coat on a surface of the fluoride-based red phosphor or on a surface of the fluoride-based red phosphor coated with a fluoride not containing Mn to improve reliability at high temperatures and high humidity. In the case of the fluoride-based red phosphor described above, since a narrow full width at half maximum (FWHM) less than or equal to 40 nm may be implemented unlike other phosphors, the fluoride-based red phosphor may be used for a high-resolution TV, such as an ultra-high definition (UHD) TV.

Table 4 below indicates types of phosphors by application fields of white light emitting devices using a blue LED chip (440 nm to 460 nm) and an UV LED chip (380 nm to 430 nm).

TABLE 4

| Use | Phosphor |
| --- | --- |
| LED TV BLU | β-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Lighting | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Side View (Mobile, Laptop PC) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2$SiO$_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Electronic device (Head Lamp, etc.) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |

In addition, a QD may be used to replace a phosphor or to be mixed with a phosphor, as a wavelength conversion material.

The QD may implement various colors according to sizes thereof, and for instance, when used as a phosphor substitute, the QD may be employed as a red or green phosphor. In the case of using a QD, a narrow FWHM (for example, about 35 nm) may be implemented.

The wavelength conversion material may be implemented in a form contained in an encapsulant. Alternatively, the wavelength conversion material may be previously manufactured in a film form and may be attached to a surface of an optical structure, such as a semiconductor light emitting device or a light guide plate. In this case, the wavelength conversion material may be readily applied to a desired portion of a structure having a uniform thickness.

Figure 13:
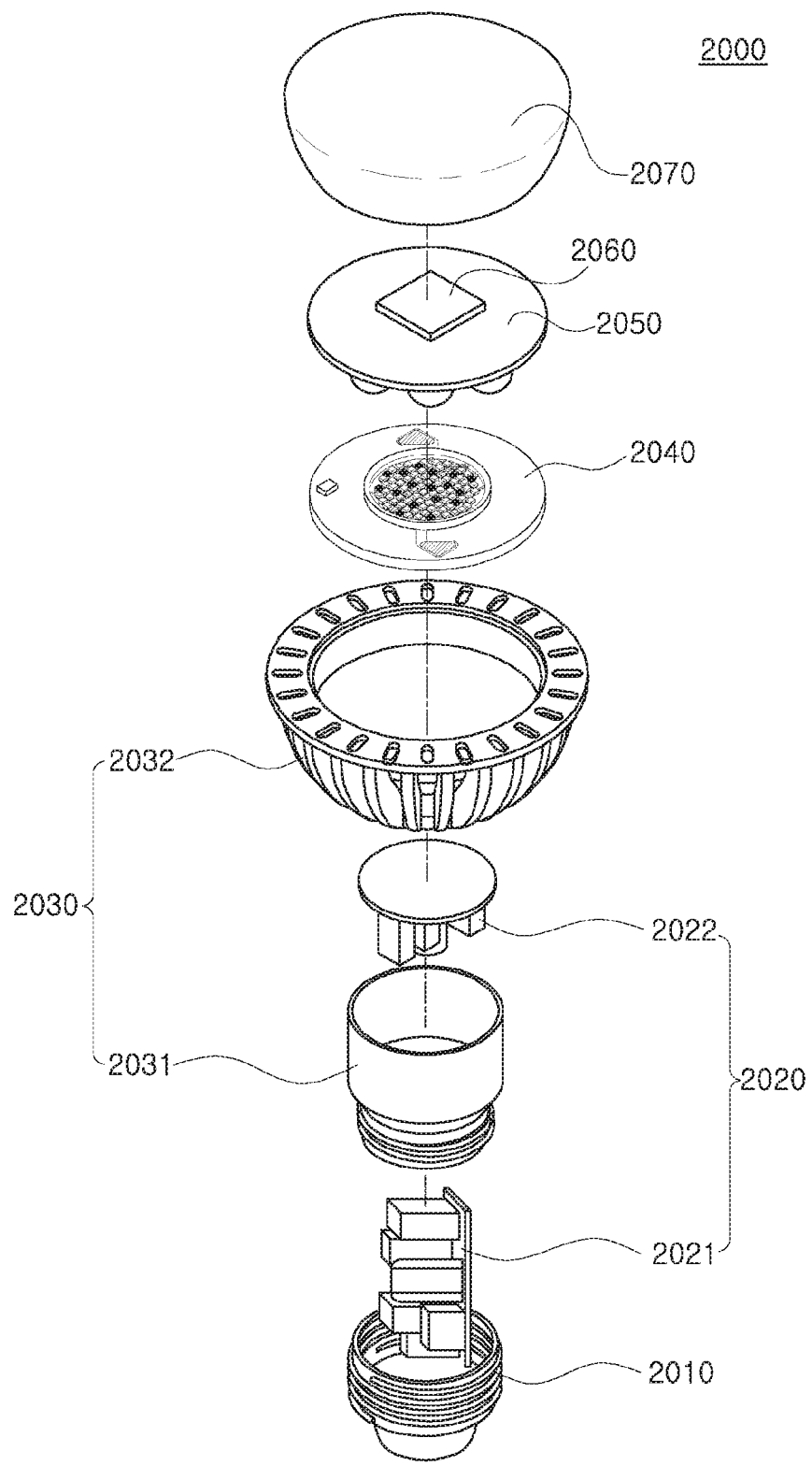
FIG. 13 is a schematic exploded perspective view of a lamp including a communications module as a light emitting apparatus according to some example embodiments of the inventive concepts.

FIG. 13 is a schematic exploded perspective view of a lamp including a communications module as a light emitting apparatus according to some example embodiments of the inventive concepts.

Referring to FIG. 13, a light emitting apparatus 2000 may include a socket 2010, a power supply 2020, a heat sink 2030, a light source module 2040, and an optical unit 2070.

Power supplied to the light emitting apparatus 2000 may be applied through the socket 2010. The socket 2010 may be configured to replace that of a conventional light emitting apparatus. As illustrated in FIG. 13, the power supply 2020 may be attached with a first power supply unit 2021 and a second power supply unit 2022. The heat sink 2030 may include an internal heat sink 2031 and an external heat sink 2032. The internal heat sink 2031 may be directly connected to the light source module 2040 and/or the power supply 2020. This may allow heat to be transferred to the external heat sink 2032. The optical unit 2070 may be configured to evenly scatter light emitted by the light source module 2040.

The light source module 2040 may include the light source module 1000 according to an example embodiment described above with reference to FIGS. 2 and 3.

A reflector 2050 may be included above the light source module 2040, and may reduce glare by evenly diffusing light emitted by a light source to a side surface and rear of the reflector 2050. A communications module 2060 may be mounted on an upper portion of the reflector 2050, and may perform home network communications. For example, the communications module 2060 may be a wireless communications module using Zigbee®, Wi-Fi, or light fidelity (Li-Fi), and may control on and off functions and brightness of a light emitting apparatus installed in and around a home through a smartphone or a wireless controller. Further, use of a Li-Fi communications module using a visible light wavelength of a light emitting apparatus installed in and around residential, commercial, or industrial spaces may control electronics such as a TV, a refrigerator, an air-conditioner, a door lock, or may control a vehicle. The reflector 2050 and the communications module 2060 may be covered with the optical unit 2070.

Figure 14A:
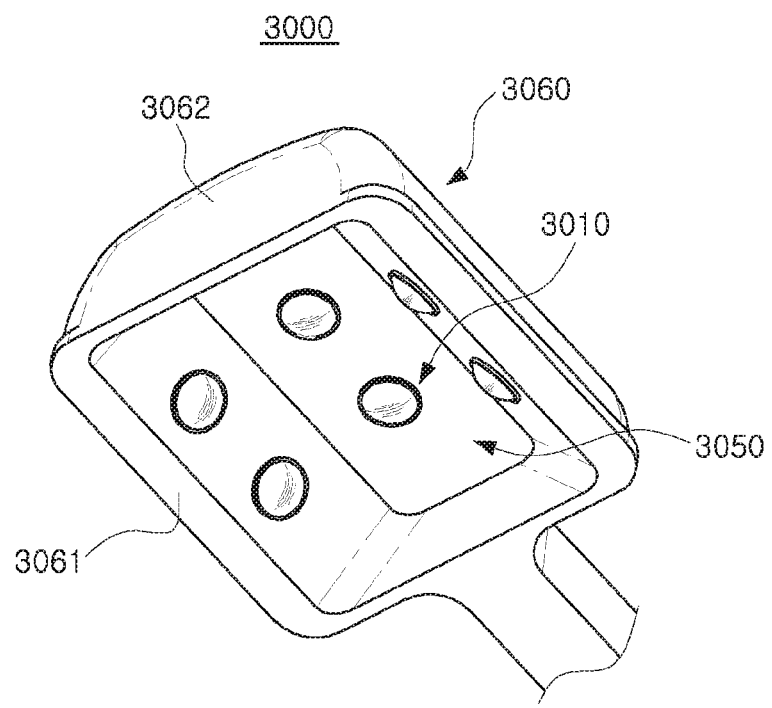
FIG. 14A is a schematic perspective view of a light emitting apparatus according to some example embodiments of the inventive concepts.
Figure 14B:
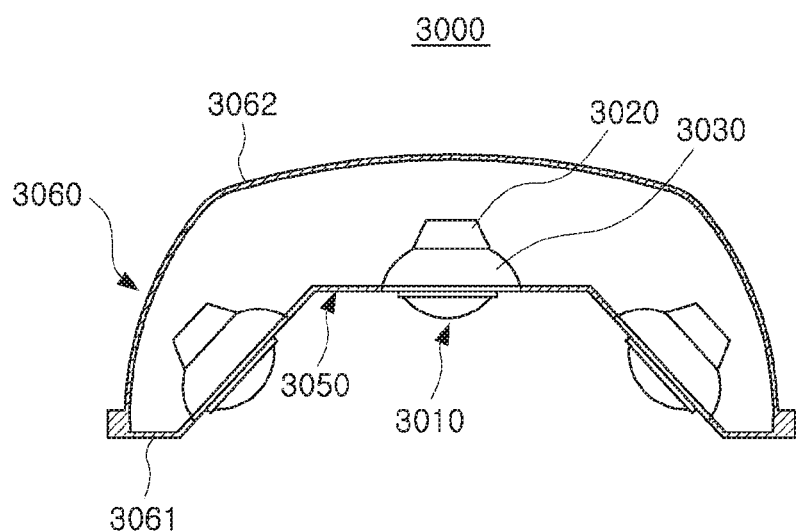
FIG. 14B is a schematic cross-sectional view of the light emitting apparatus according to some example embodiments of the inventive concepts.

FIG. 14A is a schematic perspective view of a light emitting apparatus according to some example embodiments of the inventive concepts. FIG. 14B is a schematic cross-sectional view of a light emitting apparatus according to some example embodiments of the inventive concepts.

Referring to FIGS. 14A and 14B, a light emitting apparatus 3000 according to an example embodiment may be exemplified as a streetlamp. The light emitting apparatus 3000 may include a housing 3060, a reflector 3050 mounted to the housing 3060, a power supply 3020, a heat sink 3030 fastened to the reflector 3050, and a light source module 3010 mounted to the heat sink 3030.

The power supply 3020 and the heat sink 3030 may have substantially the same configuration as the power supply 2020 and the heat sink 2030 described above with reference to FIG. 13, and descriptions of these will thus be omitted.

The reflector 3050 may include a material having high light reflectivity, and for example, may include a metallic material. The housing 3060 may include an internal frame 3061 and an external frame 3062. The reflector 3050 may be fastened to the internal frame 3061 of the housing 3060 to be fixed thereto, and may be covered with the external frame 3062 fastened to the internal frame 3061, thereby being protected.

Figure 15:
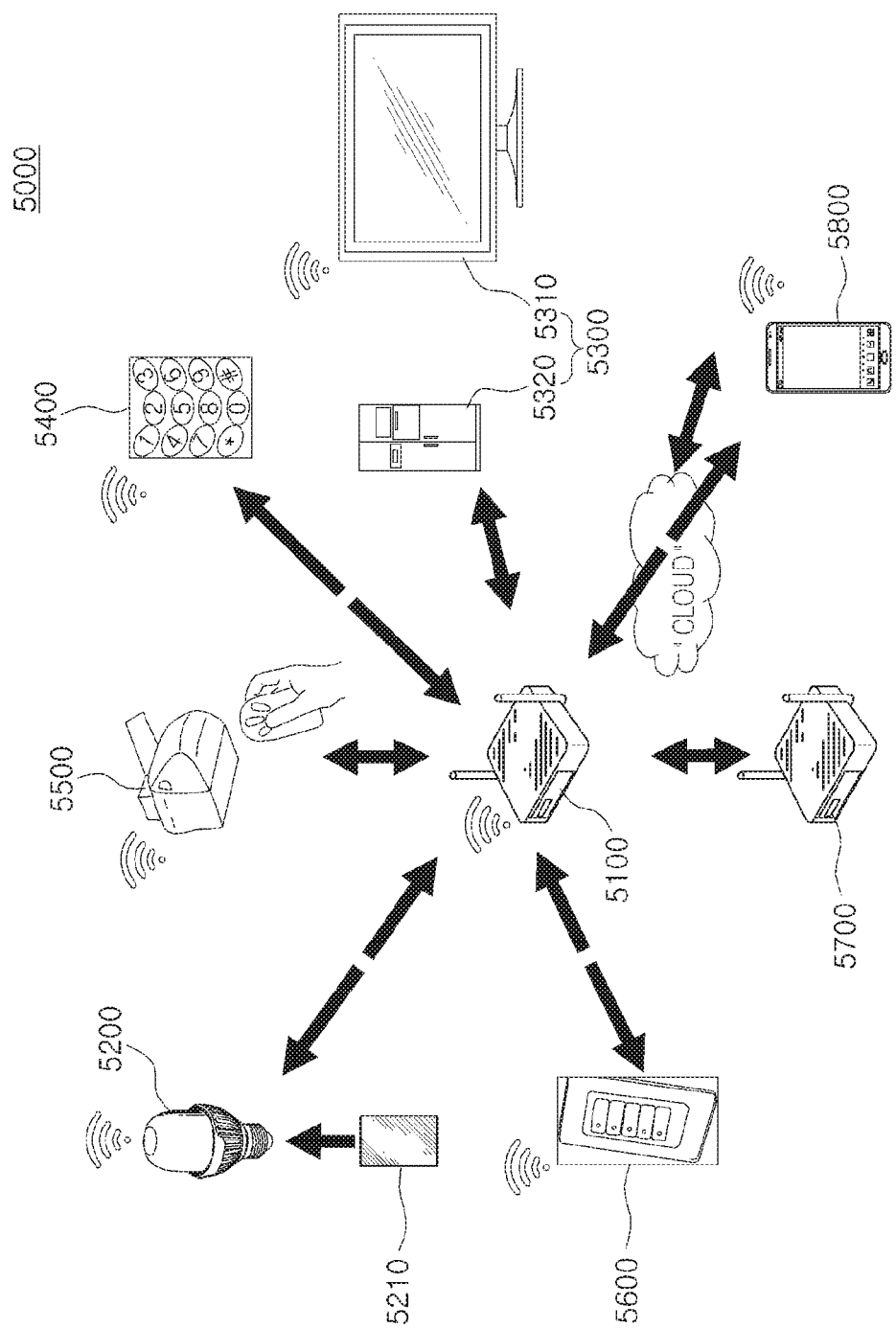
FIG. 15 is a schematic diagram of an indoor lighting control network system.

FIG. 15 is a schematic diagram of an indoor lighting control network system.

A network system 5000 according to some example embodiments of the inventive concepts may be a complex smart lighting-network system in which lighting technology, Internet of Things (IoT) technology, wireless communications technology, and the like using a light emitting device, such as an LED, converge. The network system 5000 may be implemented using various types of light emitting apparatuses and wired and wireless communications devices, and may be realized by a sensor, a controller, a communications unit, software for network control and maintenance, and the like.

The network system 5000 may be applied to an open space such as a park or a street, as well as to a closed space defined within a building, such as a home or an office. The network system 5000 may be implemented on the basis of an IoT environment to collect and process various pieces of information and provide the collected and processed information to a user. In this case, an LED lamp 5200 included in the network system 5000 may function to check and control operating states of other devices 5300 to 5800 included in the IoT environment on the basis of a function of the LED lamp 5200 such as visible light communications, as well as to receive information regarding surroundings from a gateway 5100 to control lighting of the LED lamp 5200 itself.

Referring to FIG. 15, the network system 5000 may include the gateway 5100 processing data transmitted and received according to different communications protocols, the LED lamp 5200 connected to the gateway 5100 to communicate therewith and including an LED, and the plurality of devices 5300 to 5800 connected to the gateway 5100 to communicate therewith according to various wireless communications schemes. To implement the network system 5000 on the basis of the IoT environment, the respective devices 5300 to 5800 including the LED lamp 5200 may include at least one communications module. In an example embodiment, the LED lamp 5200 may be connected to the gateway 5100 to communicate therewith by wireless communications protocols such as Wi-Fi, Zigbee®, and Li-Fi, and to this end, the LED lamp 5200 may have at least one lamp communications module 5210.

As described above, the network system 5000 may be applied to an open space such as a park or a street, as well as to a closed space such as a home or an office. When the network system 5000 is applied to a home, the plurality of devices 5300 to 5800 included in the network system 5000 and connected to the gateway 5100 to communicate therewith on the basis of IoT technology may include home appliances 5300, such as a television 5310 or a refrigerator 5320, a digital door lock 5400, a garage door lock 5500, a lighting switch 5600 installed on a wall or the like, a router 5700 for wireless communications network relay, and a mobile device 5800, such as a smartphone, a tablet PC, or a laptop PC.

In the network system 5000, the LED lamp 5200 may check the operating states of the various devices 5300 to 5800 or may automatically control luminance of the LED lamp 5200 itself according to the devices' surroundings and circumstances using wireless communications networks (Zigbee®, Wi-Fi, Li-Fi, and the like) installed in a home. Using Li-Fi communications using visible light emitted by the LED lamp 5200 may control the devices 5300 to 5800 included in the network system 5000.

First, the LED lamp 5200 may automatically control the luminance of the LED lamp 5200 on the basis of information regarding surroundings transmitted from the gateway 5100 through the lamp communications module 5210, or information regarding circumstances collected by a sensor mounted in the LED lamp 5200. For example, brightness of the LED lamp 5200 may be automatically controlled according to a type of a program being broadcast on the television 5310 or brightness of an image. To this end, the LED lamp 5200 may receive operational information of the television 5310 from the lamp communications module 5210 connected to the gateway 5100. The lamp communications module 5210 may be integrally modularized with a sensor and/or a controller included in the LED lamp 5200.

For example, when a program broadcast on the television 5310 is a drama, a color temperature of illumination may be controlled to be less than or equal to 12,000K, for example, 5,000K, according to desired (and/or alternatively, predetermined) settings to control colors, thereby creating a cozy atmosphere. In a different manner, when a program is a comedy, the network system 5000 may be configured in such a manner that a color temperature of illumination may be increased to 5,000K or more and to be blue-based white lighting according to desired (and/or alternatively, predetermined) settings.

When a certain period of time has elapsed after the digital door lock 5400 is locked while there is no person in a home, the network system 5000 may allow all LED lamps 5200 turned on to be turned off, thereby limiting and/or preventing a waste of electricity. Alternatively, when a security mode is set by the mobile device 5800 or the like, if the digital door lock 5400 is locked while there is no person in a home, the network system 5000 may allow the LED lamps 5200 to remain turned on.

Operations of the LED lamp 5200 may also be controlled according to information regarding circumstances collected by various types of sensors connected to the network system 5000. For example, when the network system 5000 is implemented within a building, a light, a position sensor, and a communications module may be combined with each other in the building to collect information on locations of people in the building so that the light may be turned on or off, or the collected information may be provided to a user in real time, thereby enabling facility management or efficient use of an idle space. In general, since alight emitting apparatus such as the LED lamp 5200 is disposed in almost all of the spaces on each floor of a building, various pieces of information in the building may be collected by a sensor integrated with the LED lamp 5200, and the collected information may be used to manage facilities or utilize an idle space.

Meanwhile, a combination of the LED lamp 5200 with an image sensor, a storage device, the lamp communications module 5210, and the like may allow the LED lamp 5200 to be utilized as a device that may maintain building security or detect and deal with an emergency. For example, when a smoke or temperature sensor is attached to the LED lamp 5200, the LED lamp 5200 may quickly detect whether a fire or the like occurs, thereby significantly reducing damage to the building, and may also control brightness of lighting considering external weather or an amount of sunshine, thereby saving energy and providing a comfortable lighting environment.

Figure 16:
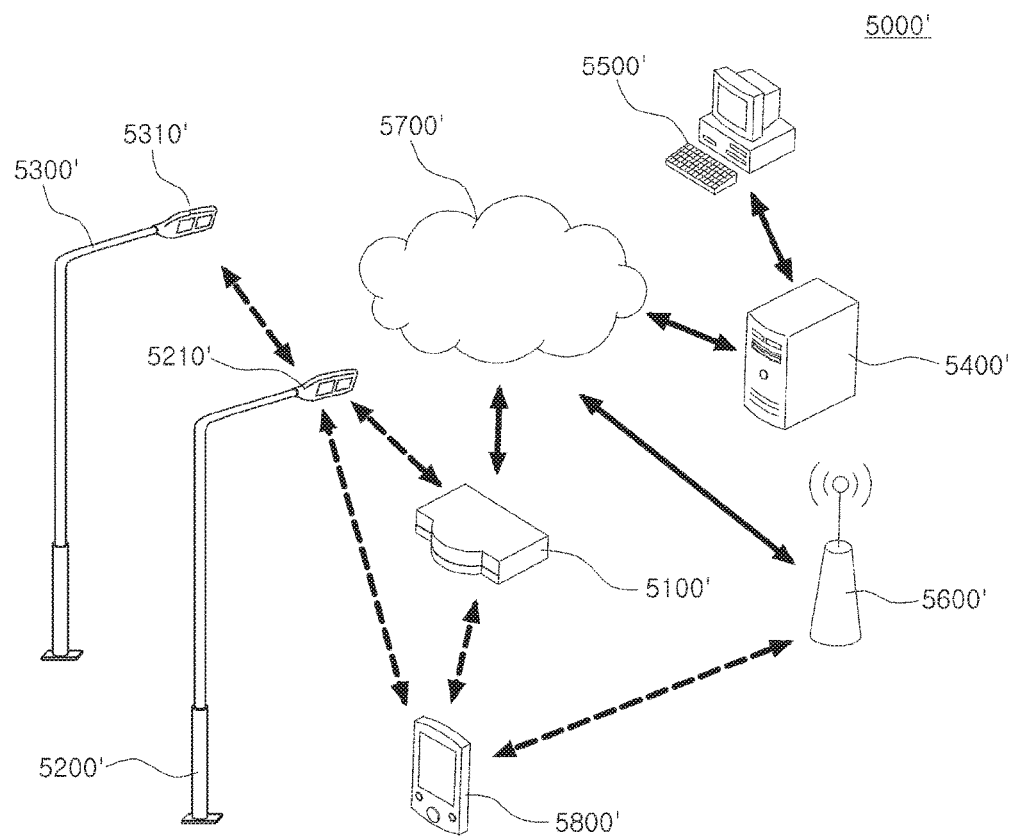
FIG. 16 is an example of a network system applied to an open space.

FIG. 16 is an example of a network system applied to an open space.

Referring to FIG. 16, a network system 5000' according to an example embodiment may include a communications connection device 5100', a plurality of lighting fixtures 5200' and 5300' installed at desired (and/or alternatively, predetermined) intervals and connected to the communications connection device 5100' to communicate therewith, a server 5400', a computer 5500' managing the server 5400', a communications base station 5600', a communications network 5700' connecting the above-mentioned communicable devices, a mobile device 5800', and the like.

The plurality of lighting fixtures 5200' and 5300' installed in an external open space such as a street or a park may include smart engines 5210' and 5310', respectively. Each of the smart engines 5210' and 5310' may include a sensor collecting information regarding surroundings, a communications module, and the like, in addition to a light emitting device emitting light and a driver driving the light emitting device. The communications module may allow the smart engines 5210' and 5310' to communicate with other surrounding devices according to communications protocols such as Wi-Fi, Zigbee®, and Li-Fi.

As an example, one smart engine 5210' may be connected to the other smart engine 5310' to communicate therewith. In this case, Wi-Fi extension technology (Wi-Fi mesh) may be applied to communications between the smart engines 5210' and 5310'. At least one smart engine 5210' may be connected to the communications connection device 5100' linked to the communications network 5700' through wired and wireless communications. To increase communications efficiency, several smart engines 5210' and 5310' may be grouped into one to be connected to a single communications connection device 5100'.

The communications connection device 5100' may relay communications between the communications network 5700' and other devices, as an access point (AP) that enables wired and wireless communications. The communications connection device 5100' may be connected to the communications network 5700' by at least one wired and wireless communications method, and may be mechanically accommodated in one of the lighting fixtures 5200' and 5300' as an example.

The communications connection device 5100' may be connected to the mobile device 5800' using a communications protocol such as Wi-Fi. A user of the mobile device 5800' may receive information regarding surroundings collected by the plurality of smart engines 5210' and 5310' through the communications connection device 5100' connected to the smart engine 5210' of an adjacent surrounding lighting fixture 5200'. The information regarding the surroundings may include surrounding traffic information, weather information, and the like. The mobile device 5800' may be connected to the communications network 5700' by a wireless cellular communications method such as 3G or 4G through the communications base station 5600'.

Meanwhile, the server 5400' connected to the communications network 5700' may monitor operational states or the like of the respective lighting fixtures 5200' and 5300' while receiving information collected by the smart engines 5210' and 5310' respectively mounted in the lighting fixtures 5200' and 5300'. To manage the respective lighting fixtures 5200' and 5300' on the basis of the monitoring results of the operating states of the respective lighting fixtures 5200' and 5300', the server 5400' may be connected to the computer 5500' providing a management system. The computer 5500' may execute software or the like able to monitor and manage operating states of the respective lighting fixtures 5200' and 5300', particularly the smart engines 5210' and 5310'.

Figure 17:
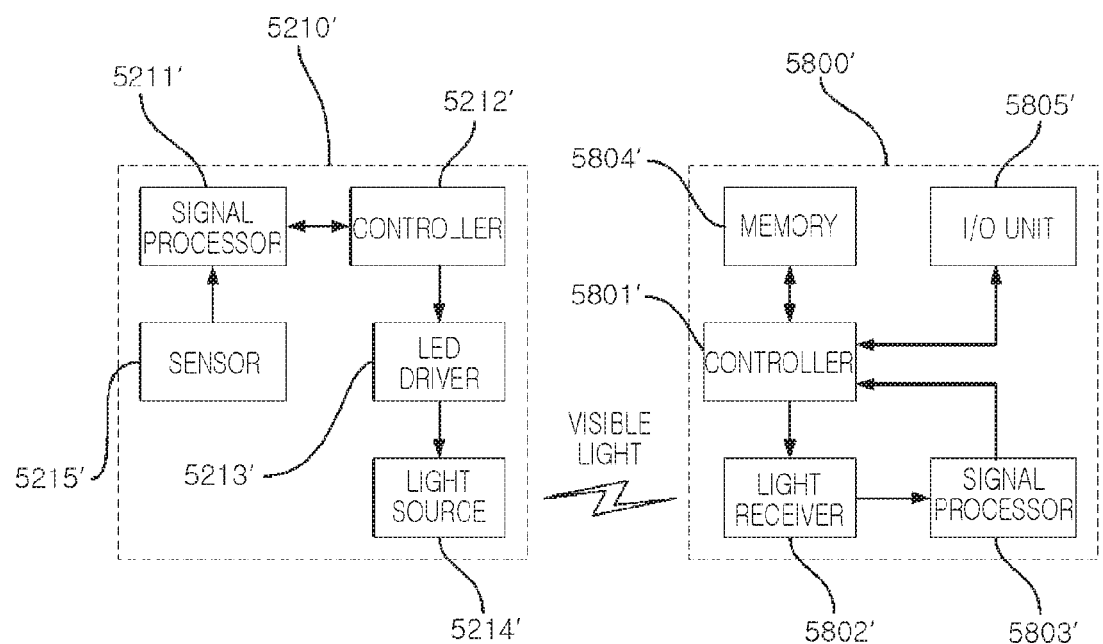
FIG. 17 is a block diagram illustrating communications operations between a smart engine of a lighting fixture and a mobile device by visible light communications.

FIG. 17 is a block diagram illustrating communications operations between a smart engine of a lighting fixture and a mobile device by visible light communications.

Referring to FIG. 17, a smart engine 5210' may include a signal processor 5211', a controller 5212', an LED driver 5213', alight source 5214', a sensor 5215', and the like. A mobile device 5800' connected to the smart engine 5210' through visible light communications may include a controller 5801', a light receiver 5802', a signal processor 5803', a memory 5804', an input/output (I/O) unit 5805', and the like.

Visible light communications technology, Li-Fi, may be used to wirelessly transmit information using light in the visible spectrum that can be recognized by the human eye. Such visible light communications technology may be distinguished from conventional wired optical communications technology and wireless infrared light communications in terms of using light in a visible spectrum, that is, a certain visible light frequency from the LED package described in the example embodiment, and may be differentiated from wired optical communications technology in terms of a wireless communications environment. The wireless visible light communications technology may be convenient in that a user may freely use it without being restricted or permitted in terms of use of frequency unlike radio frequency (RF) wireless communications, may be distinctive in that physical security is excellent and a user may see a communications link with the naked eye, and principally, may have a characteristic of convergence technology that unique purposes and communications functions of a light source may be simultaneously obtained.

The signal processor 5211' of the smart engine 5210' may process data that is desired to be transmitted and received by visible light communications. As an example, the signal processor 5211' may process information collected by at least one sensor 5215' of an illumination sensor, a motion sensor, and an image sensor into data and transmit the data to the controller 5212'. The controller 5212' may control operations of the signal processor 5211', the LED driver 5213', and the like, and in particular, may control operations of the LED driver 5213' on the basis of data transmitted from the signal processor 5211'. The LED driver 5213' may transmit data to the mobile device 5800' by allowing the light source 5214' to emit light in response to a control signal transmitted from the controller 5212'.

The mobile device 5800' may include the light receiver 5802' recognizing visible light including data in addition to the controller 5801', the memory 5804' storing data, the I/O unit 5805' including a display, a touchscreen, an audio output unit, and the like, and the signal processor 5803'. The light receiver 5802' may detect visible light and convert the detected visible light into an electrical signal, and the signal processor 5803' may decode data included in the electrical signal converted by the light receiver 4802'. The controller 5801' may store the data decoded by the signal processor 5803' to the memory 5804' or output the decoded data through the I/O unit 5805' or the like in such a manner that a user may recognize the decoded data.

As set forth above, according to some example embodiments of the inventive concepts, a light emitting apparatus having improved color quality and a method of manufacturing the same may be provided by optimizing a ratio of luminous flux of a light source emitting white light to that of a light source emitting cyan light.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light emitting apparatus comprising:
   at least one first light source configured to emit white light, the at least one first light source including,
   at least one light emitting diode (LED) chip configured to emit light having a peak wavelength in a wavelength region of about 440 nm to about 460 nm, and
   at least one phosphor configured to be excited by light emitted by the at least one LED chip, such that the at least one phosphor emits light having a peak wavelength in a wavelength region of about 490 nm to about 580 nm or a wavelength region of about 580 nm to about 630 nm; and
   at least one second light source configured to emit cyan light having a peak wavelength in a wavelength region of about 460 nm to about 490 nm,
   wherein the light emitting apparatus is configured to apply a common magnitude of electrical power to each of the at least one first light source and the at least one second light source such that a ratio of luminous flux of the white light emitted by the at least one first light source to luminous flux of the cyan light emitted by the at least one second light source ranges from about 19:1 to about 370:1.

2. The light emitting apparatus of claim 1, wherein a quantity of the at least one second light source is from about 1% to about 16% of a total quantity of the at least one first light source and the at least one second light source.

3. The light emitting apparatus of claim 2, further comprising:
   an array of at least one first light source and at least one second light source, the array including a pattern of the at least one second light source.

4. The light emitting apparatus of claim 1, further comprising:
   a driving controller configured to control a supply of electrical power to each of the at least one first light source and the at least one second light source,
   the driving controller being configured to apply a first electrical current to the at least one first light source, the first electrical current having a first magnitude, and
   the driving controller being configured to apply a second electrical current to the at least one second light source, the second electrical current having a second magnitude, the second magnitude being different from the first magnitude.

5. The light emitting apparatus of claim 4, wherein the driving controller is configured to transmit at least one of color rendering index (CRI) data associated with the light emitting apparatus and correlated color temperature (CCT) data associated with the light emitting apparatus to at least one device external to the light emitting apparatus.

6. The light emitting apparatus of claim 4, wherein
   the driving controller is configured to process data generated by at least one of an illumination sensor, a motion sensor, and an image sensor, and
   the driving controller is configured to transmit the processed data to at least one device external to the light emitting apparatus.

7. The light emitting apparatus of claim 1, wherein the at least one first light source further includes a reflective layer on a side of the at least one LED chip.

8. The light emitting apparatus of claim 1, wherein
   the at least one first light source includes a phosphor layer, the phosphor layer configured to convert a portion of blue light emitted by the at least one LED chip into light having a wavelength different from a wavelength of the blue light, and
   the at least one second light source includes a transparent resin layer in place of the phosphor layer, the transparent resin layer being independent of wavelength conversion material, the transparent resin layer including a stacked transparent film, the stacked transparent film is configured to widen a viewing angle of the at least one second light source, such that the viewing angle of the at least one second light source is equal to or greater than a viewing angle of the at least one first light source.

9. The light emitting apparatus of claim 8, wherein
   the at least one first light source includes an active layer, the active layer including a first concentration of indium (In); and
   the at least one second light source includes a nitride semiconductor layer, the nitride semiconductor layer including a second concentration of indium (In), the second concentration of In being greater than the first concentration of In.

10. The light emitting apparatus of claim 1, further comprising:
    a substrate, wherein the at least one first light source and the at least one second light source are each mounted on the substrate such that the light emitting apparatus has a flip-chip structure of light sources.

11. The light emitting apparatus of claim 1, wherein,
the at least one first light source and the at least one second light source are configured to emit mixed light, a light emission spectrum of mixed light emitted by the at least one first light source and the at least one second light source including at least three light emission peak wavelengths, the at least three light emission peak wavelengths include a first light emission peak wavelength and a second light emission peak wavelength, and
a ratio of intensity of the first light emission peak wavelength to intensity of the second light emission peak wavelength ranges from 0.3 to 1.5 at a shortest wavelength.

12. The light emitting apparatus of claim 11, wherein the at least one first light source and the at least one second light source are configured to emit mixed light having a CRI from about 80 to about 99.

13. The light emitting apparatus of claim 1, wherein the light emitting apparatus is configured to control a supply of electrical power to the at least one first light source and the at least one second light source, such that a correlated color temperature (CCT) of mixed light emitted by the at least one first light source and the at least one second light source is from about 2,000K to about 8,000K.

14. A light emitting apparatus comprising:
at least one first light source configured to emit white light;
at least one second light source configured to emit cyan light; and
a driving control chip configured to control a separate supply of electrical power to each of the at least one first light source and the at least one second light source, such that a common magnitude of electrical current is applied to each of the at least one first light source and the at least one second light source, and a ratio of luminous flux of the white light to luminous flux of the cyan light ranges from about 19:1 to about 370:1 at an identically applied current.

15. The light emitting apparatus of claim 14, wherein
the driving control chip is configured to process data provided by at least one of an illumination sensor, a motion sensor, and an image sensor, and
the driving control chip is configured to transmit the processed data to a device external to the light emitting apparatus.

16. An apparatus, comprising:
a substrate; and
an array of light sources on the substrate, the array including a pattern of at least one first light source and at least one second light source, the at least one first light source being configured to emit white light and the at least one second light source being configured to emit cyan light;
the array of light sources being configured to emit white light and cyan light, based on a common magnitude of electrical power being received at both the at least one first light source and the at least one second light source, such that a ratio of luminous flux of the white light emitted by the at least one first light source to luminous flux of the cyan light emitted by the at least one second light source ranges from about 19:1 to about 370:1.

17. The apparatus of claim 16, further comprising:
a drive control chip electrically coupled to the array of light sources, the drive control chip being configured to independently control a separate supply of electrical power to each of the at least one first light source and the at least one second light source.

18. The apparatus of claim 17, wherein the drive control chip is configured to control the separate supplies of electrical power to the at least one first light source and the at least one second light source, such that different magnitudes of electrical current are applied to the at least one first light source and the at least one second light source, respectively.

19. The apparatus of claim 16, further comprising:
a dam on the substrate, the dam protruding from the substrate, the dam surrounding the array of light sources such that the dam defines an internal space in which the array of light sources is included.

20. The apparatus of claim 16, wherein,
the at least one first light source includes,
at least one light emitting diode (LED) chip configured to emit light having a peak wavelength in a wavelength region of about 440 nm to about 460 nm, and
at least one phosphor configured to be excited by light emitted by the at least one LED chip, such that the at least one phosphor emits light having a peak wavelength in a wavelength region of about 490 nm to about 580 nm or a wavelength region of about 580 nm to about 630 nm; and the at least one second light source is configured to emit
cyan light having a peak wavelength in a wavelength region of about 460 nm to about 490 nm.

* * * * *